(12) United States Patent
Liu et al.

(10) Patent No.: US 12,193,207 B2
(45) Date of Patent: Jan. 7, 2025

(54) SEMICONDUCTOR DEVICE AND METHOD FOR MANUFACTURING THE SAME

(71) Applicant: CHANGXIN MEMORY TECHNOLOGIES, INC., Hefei (CN)

(72) Inventors: Xinran Liu, Hefei (CN); Yule Sun, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 615 days.

(21) Appl. No.: 17/476,794

(22) Filed: Sep. 16, 2021

(65) Prior Publication Data

US 2022/0085021 A1    Mar. 17, 2022

Related U.S. Application Data

(63) Continuation of application No. PCT/CN2021/100413, filed on Jun. 16, 2021.

(30) Foreign Application Priority Data

Sep. 14, 2020 (CN) .......................... 202010962311.1

(51) Int. Cl.
H10B 12/00 (2023.01)

(52) U.S. Cl.
CPC .............. *H10B 12/03* (2023.02); *H10B 12/30* (2023.02)

(58) Field of Classification Search
CPC ....... H01L 28/90; H10B 12/03; H10B 12/033; H10B 12/30; H10B 12/315; H10B 12/0335
See application file for complete search history.

(56) References Cited

U.S. PATENT DOCUMENTS

| 7,387,939 | B2 | 6/2008 | Manning |
| 8,405,136 | B2 | 3/2013 | Cho et al. |
| 8,497,142 | B2 | 7/2013 | Yang |
| 2002/0014403 | A1 | 2/2002 | Hoshino |

(Continued)

FOREIGN PATENT DOCUMENTS

| CN | 101431063 A | 5/2009 |
| CN | 107731794 A | 2/2018 |

(Continued)

OTHER PUBLICATIONS

Written Opinion cited in PCT/CN2021/100413, mailed on Sep. 15, 2021, 6 pages.

(Continued)

*Primary Examiner* — Michelle Mandala
*Assistant Examiner* — Kevin Quinto
(74) *Attorney, Agent, or Firm* — Kilpatrick Townsend & Stockton LLP

(57) ABSTRACT

The present disclosure provides a semiconductor device and a method for manufacturing the same, and relates to the field of semiconductor technologies. The manufacturing method includes: providing a substrate and forming a film layer stack structure thereon; etching the film layer stack structure to form a first region containing a through hole through which the substrate is exposed and a second region containing a hole section through which the substrate is not exposed; and patterning and etching the second region to remove the film layer stack structure within the second region.

16 Claims, 8 Drawing Sheets

(56) References Cited

U.S. PATENT DOCUMENTS

2004/0110340 A1    6/2004  Kim et al.
2011/0281379 A1   11/2011  Yang et al.
2021/0050221 A1*  2/2021  Kim .................. H01L 21/31144

FOREIGN PATENT DOCUMENTS

CN       108231772 A    6/2018
CN       108346661 A    7/2018
CN       109065501 A   12/2018

OTHER PUBLICATIONS

International Search Report cited in PCT/CN2021/100413, mailed Sep. 16, 2021, 9 pages.

* cited by examiner

SEMICONDUCTOR DEVICE AND METHOD FOR MANUFACTURING THE SAME

CROSS-REFERENCE TO RELATED APPLICATIONS

This application is a continuation application of International Patent Application No.: PCT/CN2021/100413, filed on Jun. 16, 2021, which claims priority to Chinese Patent Application No. 202010962311.1, filed with the Chinese Patent Office on Sep. 14, 2020 and entitled "SEMICONDUCTOR DEVICE AND METHOD FOR MANUFACTURING THE SAME." International Patent Application No.: PCT/CN2021/100413 and Chinese Patent Application No. 202010962311.1 are incorporated herein by reference in their entireties.

TECHNICAL FIELD

The present disclosure relates to the field of semiconductor technologies, and more particularly to a semiconductor device and a method for manufacturing the same.

BACKGROUND

A dynamic random-access memory (DRAM) is widely used in mobile devices such as mobile phones and tablet computers because of the advantages of small volume, high degree of integration, and fast transmission speed. A capacitor, as a core component of the dynamic random-access memory, is mainly used to store charges.

Usually, during manufacture of a capacitor, a supporting layer and a sacrificial layer which are overlapped are required to be formed on a substrate, the supporting layer and the sacrificial layer are etched to form a hole-like structure for accommodating the capacitor, and the sacrificial layer is removed after the capacitor is formed. However, due to the limitation of preparation processes, etching depths of film layers in different etching regions are different. After the sacrificial layer is removed, some capacitors fail due to floating.

It should be noted that the above information disclosed in the Background section is only for enhancement of understanding of the background of the present disclosure, and therefore it may include information that does not form the prior art that is already known to a person of ordinary skill in the art.

SUMMARY

The present disclosure provides a semiconductor device and a method for manufacturing the same.

According to an aspect of the present disclosure, a method for manufacturing a semiconductor device is provided, including: providing a substrate and forming a film layer stack structure thereon; etching the film layer stack structure to form a first region containing a through hole through which the substrate is exposed and a second region containing a hole section through which the substrate is not exposed; and patterning and etching the second region to remove the film layer stack structure within the second region.

According to an aspect of the present disclosure, a semiconductor device is provided, wherein the semiconductor device is prepared by the method for manufacturing a semiconductor device according to any one of the above embodiments.

BRIEF DESCRIPTION OF DRAWINGS

The accompanying drawings are incorporated in the Description and constitute a part of the Description, show embodiments conforming to the present disclosure, and are used together with the Description to explain the principle of the present disclosure. Apparently, the accompanying drawings in the following description show only some embodiments of the present disclosure, and a person of ordinary skill in the art may still derive other drawings from these accompanying drawings without creative efforts.

DESCRIPTION OF EMBODIMENTS

Figure 1:
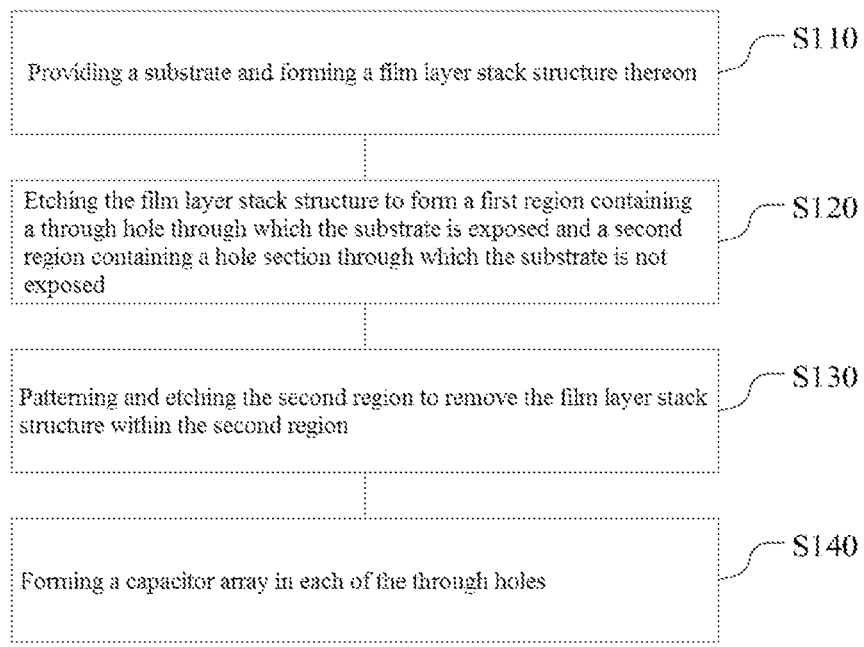
FIG. 1 is a flowchart of a method for manufacturing a semiconductor device according to an embodiment of the present disclosure.

Now exemplary embodiments will be described more fully with reference to the accompanying drawings. However, the exemplary embodiments can be implemented in various ways and shall not be construed as limited to the embodiments set forth herein; rather, these embodiments are provided to make the present disclosure full and complete, and fully convey the concept of the exemplary embodiments to those skilled in the art. Like reference numerals through the drawings denote the same or similar structures, and thus their detailed description will be omitted.

The features, structures, or characteristics described above can be combined in one or more embodiments in any suitable manner. If possible, the features discussed in the embodiments are interchangeable. In the above description, many specific details are provided in order to provide a sufficient understanding of the embodiments of the present invention. However, those skilled in the art will appreciate that the technical solution of the present disclosure may be practiced without one or more of the specific details, or other methods, materials, etc. may be used. In other cases, well-known structures, materials, or operations are not shown or described in detail to avoid obscuring aspects of the present disclosure.

Although relative terms such as "upper" and "lower" are used in the Description to describe the relative relationship of one component with respect to another component as shown in the figures, these terms are used in this Description only for convenience, for example, based on the exemplary directions shown in the figures. It is to be understood that if an apparatus shown in the figures is turned upside down, the described "upper" component will become a "lower" component. When a structure is "on" another structure, it may mean that the structure is integrally formed on the another structure, or that the structure is "directly" provided on the another structure, or that the structure is "indirectly" provided on the another structure via still another structure.

The terms "a", "an", "the", "said", and "at least one" are used to indicate the presence of one or more elements/components etc. The terms "include" and "have" are used to indicate the meaning including an opening inclusion and indicate that there may be other elements/components etc. in addition to the listed elements/components etc. The terms "first" and "second" are only used as reference only, not as a restriction on the number of their subjects.

An embodiment of the present disclosure provides a method for manufacturing a semiconductor device. As shown in FIG. 1, the manufacturing method may include steps S110, S120, S130 and S140.

In step S110, a substrate is provided and a film layer stack structure is formed thereon.

In step S120, the film layer stack structure is etched to form a first region containing a through hole through which the substrate is exposed and a second region containing a hole section through which the substrate is not exposed.

In step S130, the second region is patterned and etched to remove the film layer stack structure within the second region.

With respect to the method for manufacturing a semiconductor device according to the present disclosure, after the hole section in the second region is removed, no capacitor is formed in the hole section. Therefore, after the sacrificial layer is removed, there will be no floating capacitor, thereby preventing failure of the capacitor due to floating, also avoiding the floating capacitor being collapsed due to no support at the bottom thereof, and preventing a short circuit between adjacent capacitors. Furthermore, the through hole in the first region is reserved, so that the subsequently formed capacitor may be contacted and connected with the substrate via the through hole, and the power of the capacitor may be stored into the substrate, thereby achieving capacitor storage; and meanwhile, the bottom of the capacitor may be supported by the substrate to prevent the capacitor from being collapsed, which may improve stability of the capacitor.

The steps of the method for manufacturing a semiconductor device according to the embodiment of the present disclosure will be described in detail below: in step S110, a substrate is provided and a film layer stack structure is formed thereon.

The substrate may have a flat plate structure, which may be rectangular, circular, elliptical, polygonal or irregular, and may be made of silicon or other semiconductor materials. The shape and material of the substrate are not specifically limited here.

The substrate may include a base 1 and a bottom supporting layer 6 formed on a surface of the base 1. A plurality of storage node contact plugs 11 distributed in an array are formed within the bottom supporting layer 6, and the storage node contact plug 11 may have an annular structure, and may be made of conductive or semiconductor materials. For example, the storage node contact plug 11 may be made of tungsten, copper, or polysilicon.

For example, a plurality of via holes distributed in an array may be provided within the bottom supporting layer 6, each of the via holes may be a through hole, and the storage node contact plug 11 may be formed within the via hole. For example, the storage node contact plug 11 may be formed within the via hole by vacuum evaporation, magnetron sputtering or chemical vapor deposition, or the like. Of course, the storage node contact plug 11 may also be formed by other means, which will not be listed here.

Figure 2:
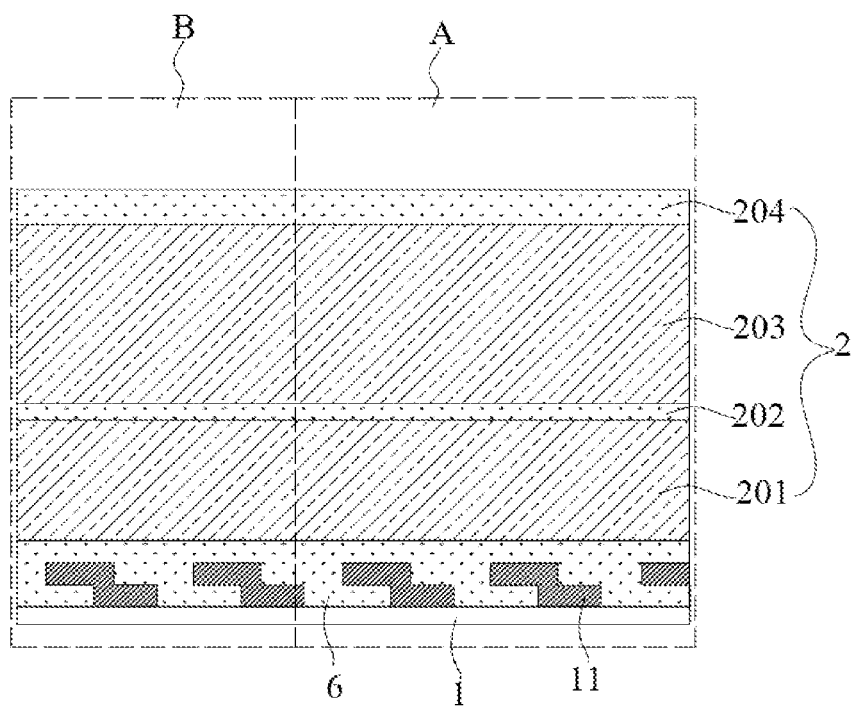
FIG. 2 is a schematic diagram after step S110 of the manufacturing method according to the present disclosure is completed.

As shown in FIG. 2, a film layer stack structure 2 may be formed on the substrate. The film layer stack structure 2 may include a single-layered film layer, or may include a multi-layered film layer, which is not specifically limited here. In an embodiment, the film layer stack structure 2 may include a multi-layered film layer. For example, the film layer stack structure 2 may include a supporting layer and a sacrificial layer which are overlapped. For example, the film layer stack structure 2 may include a first sacrificial layer 201, a first supporting layer 202, a second sacrificial layer 203, and a second supporting layer 204 which are overlapped sequentially, wherein the first sacrificial layer 201 may be formed on a surface of the bottom supporting layer 6.

The first sacrificial layer 201, the first supporting layer 202, the second sacrificial layer 203, and the second supporting layer 204 may be formed on the surface of the bottom supporting layer 6 by vacuum evaporation or magnetron sputtering, or the like. Of course, the first sacrificial layer 201, the first supporting layer 202, the second sacrificial layer 203, and the second supporting layer 204 which are overlapped may also be formed by other means, which is not specifically limited here.

The first sacrificial layer 201 may be formed on the surface of the bottom supporting layer 6, and may be made of $SiO_2$. The first supporting layer 202 may be a thin film formed on a side of the first sacrificial layer 201 facing away from the substrate, and may be made of silicon nitride or SiCN. The second sacrificial layer 203 may be formed on a side of the first supporting layer 202 facing away from the first sacrificial layer 201, may be made of the same material as that of the first sacrificial layer 201, and may have the same thickness as that of the first sacrificial layer 201. The second supporting layer 204 may be formed on a side of the second sacrificial layer 203 facing away from the first supporting layer 202, may be made of the same material as that of the first supporting layer 202, and the thickness of the first supporting layer 202 and the thickness of the second supporting layer 204 may be the same or different, which is not specifically limited here.

In step S120, the film layer stack structure is etched to form a first region containing a through hole through which the substrate is exposed and a second region containing a hole section through which the substrate is not exposed.

As shown in FIG. 2, the film layer stack structure 2 may have a first region A and a second region B which are distributed side by side, and the first region A and the second region B may be provided adjacent to each other. There may be two second regions B, and the two second regions B may be disposed on both sides of the first region A respectively. For example, the first region A may be a central region of the film layer stack structure 2, and the second region B may be an edge region of the film layer stack structure 2.

The film layer stack structure 2 may be etched to form a capacitor hole for depositing a capacitor. The capacitor hole may extend in a direction perpendicular to the substrate, and the cross-sectional shape of the capacitor hole may be circular or rectangular or irregular, and the shape of the capacitor hole is not specifically limited here.

Figure 3:
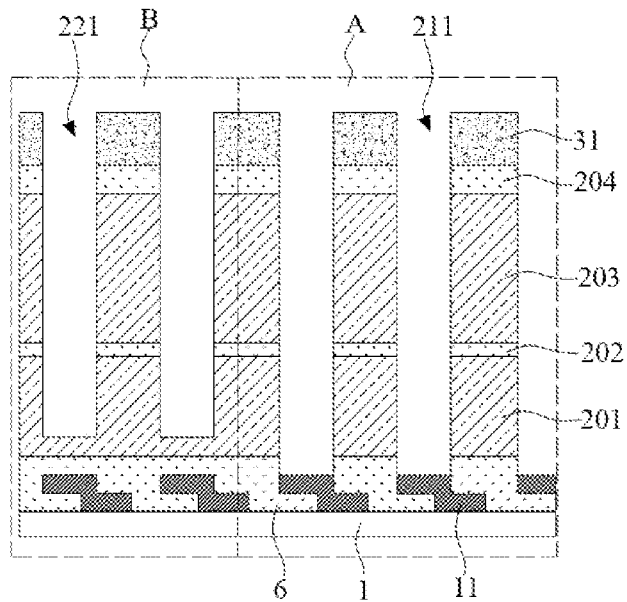
FIG. 3 is a schematic diagram after step S120 of the manufacturing method according to the present disclosure is completed.

During etching, due to the limitation of etching process, capacitor holes with different etching depths appear in different regions of the film layer stack structure 2, that is, a through hole 211 through which the substrate is exposed may be formed in the first region A, and a hole section 221 through which the substrate is not exposed may be formed in the second region B. In an embodiment of the manufacturing method according to the present disclosure, a structure after step S120 is completed is as shown in FIG. 3.

In an embodiment, there may be a plurality of through holes 211, and the plurality of through holes 211 may be distributed in an array. Correspondingly, the substrate directly opposite to the first region A may include a plurality of storage node contact plugs 11 distributed in an array. It should be noted that the number of the through holes 211 may be equal to the number of the storage node contact plugs 11, and each of the storage node contact plugs 11 may be exposed through each of the through hole 211 in a one-to-one correspondence.

Figure 4:
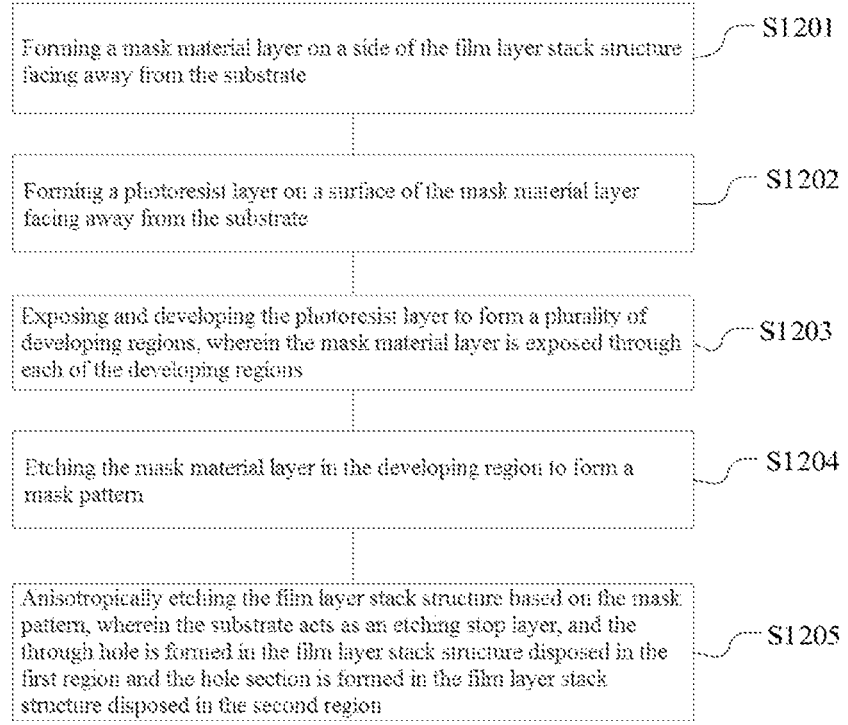
FIG. 4 is a flowchart of step S120 in FIG. 1.

In an embodiment of the present disclosure, as shown in FIG. 4, step S120 may include step S1201 to step S1205.

In step S1201, a mask material layer is formed on a side of the film layer stack structure facing away from the substrate.

The mask material layer may be formed on the side of the film layer stack structure 2 facing away from the substrate by chemical vapor deposition, vacuum evaporation, atomic layer deposition or other means. The mask material layer may have a multi-layered structure, or may have a single-layered structure. The mask material layer may be made of at least one of polymer, SiO$_2$, SiN, poly and SiCN. Of course, the mask material layer may also be made of other materials, which will not be listed here.

Figure 5:
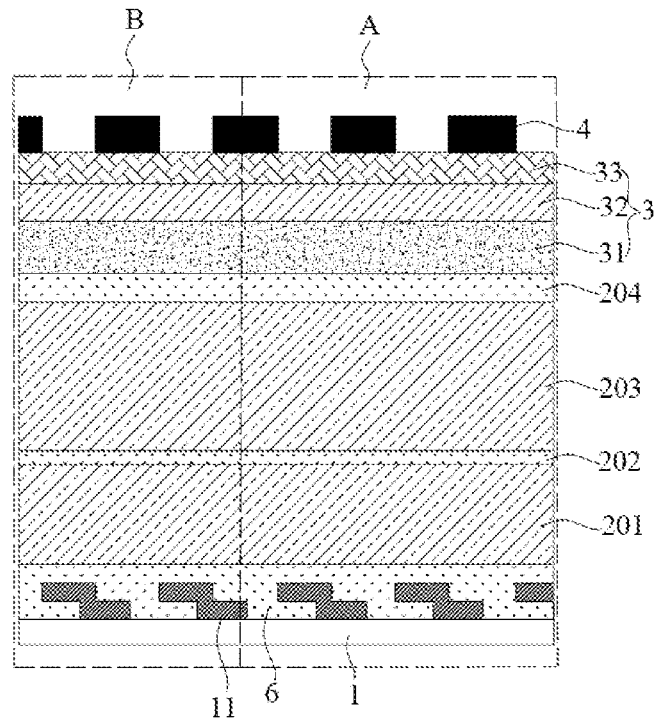
FIG. 5 is a schematic diagram after step S1203 of the manufacturing method according to the present disclosure is completed.

In an embodiment, as shown in FIG. 5, the mask material layer 3 may have a multi-layered structure, which may include a polymer layer 31, an oxide layer 32, and a hard mask layer. The polymer layer 31 may be formed on a surface of the film layer stack structure 2 facing away from the substrate. The oxide layer 32 may be disposed between the hard mask layer and the polymer layer 31. The polymer layer 31 may be formed on the surface of the film layer stack structure 2 facing away from the substrate by a chemical vapor deposition process. The oxide layer 32 may be formed on a surface of the polymer layer 31 facing away from the film layer stack structure 2 by a vacuum evaporation process. The hard mask layer may be formed on a surface of the oxide layer 32 facing away from the polymer layer 31 by an atomic layer deposition process.

In step S1202, a photoresist layer is formed on a surface of the mask material layer facing away from the substrate.

The photoresist layer 4 may be formed on the surface of the mask material layer 3 facing away from the substrate by spin coating or other means. The photoresist layer 4 may be made of positive photoresist or negative photoresist, which is not specifically limited here.

In step S1203, the photoresist layer is exposed and developed to form a plurality of developing regions, wherein the mask material layer is exposed through each of the developing regions.

The photoresist layer 4 may be exposed by using a mask, and a pattern of the mask may be matched with a pattern required by the film layer stack structure 2. Subsequently, the exposed photoresist layer 4 may be developed to form a plurality of developing regions, wherein the mask material layer 3 may be exposed through each of the developing regions, and a pattern of the developing region may be the same as the pattern required by the film layer stack structure 2. A width of the developing region may be the same as the size of the required capacitor hole. In an embodiment of the manufacturing method according to the present disclosure, a structure after step S1203 is completed is as shown in FIG. 5.

In step S1204, the mask material layer is etched in the developing region to form a mask pattern.

The mask material layer 3 may be etched in the developing region by a plasma etching process. The film layer stack structure 2 may be exposed through the etched region so as to form a desired mask pattern on the mask material layer 3. It should be noted that when the mask material layer 3 has a single-layered structure, the mask pattern may be formed by using a one-time etching process; and when the mask material layer 3 has a multi-layered structure, the layers of the mask material layer 3 may be etched one by one, that is, a one-time etching process may be performed to etch each of the layers, and the mask material layer may be etched through by using the one-time etching process repeatedly to form the mask pattern.

Figure 6:
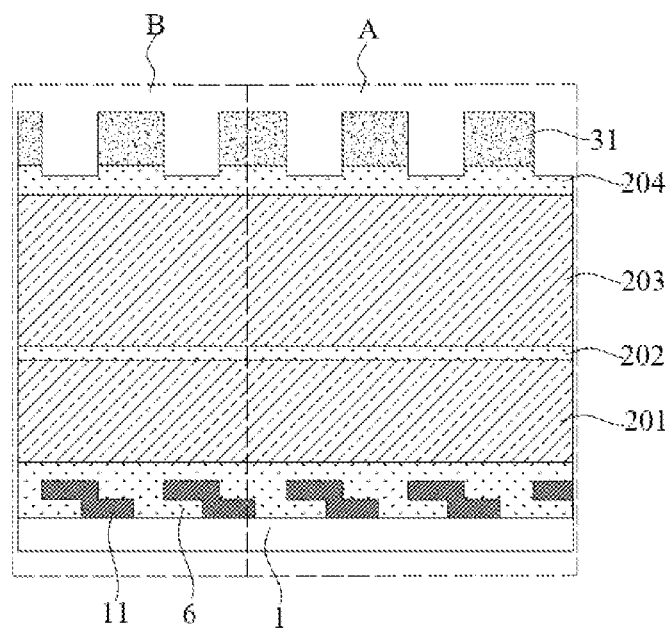
FIG. 6 is a schematic diagram after step S1204 of the manufacturing method according to the present disclosure is completed.

It should be noted that after the above-mentioned etching process is completed, the photoresist layer 4 may be removed by cleaning with a cleaning solution or by a process such as ashing, so that the mask material layer 3 is no longer covered by the photoresist layer 4, and the formed mask material layer is exposed to obtain a hard mask structure. FIG. 6 shows a structure after step S1204 in an embodiment of the manufacturing method according to the present disclosure is completed.

In step S1205, the film layer stack structure is anisotropically etched based on the mask pattern, wherein the substrate acts as an etching stop layer, and the through hole is formed in the film layer stack structure disposed in the first region and the hole section is formed in the film layer stack structure disposed in the second region.

The film layer stack structure 2 may be anisotropically etched based on the mask pattern. For example, the film layer stack structure 2 may be etched in the developing region of the mask pattern by a dry etching process, wherein the substrate acts as an etching stop layer, a plurality of capacitor holes is formed within the film layer stack structure 2. In this process, due to the limitation of manufacturing process, etching depths in different regions of the film layer stack structure 2 are different, so that a plurality of through holes 211 is formed in the film layer stack structure 2 disposed in the first region A, and one or more hole sections 221 are formed in the film layer stack structure 2 disposed in the second region B, wherein an open end of each of the hole sections 221 facing away from the substrate may be flush with an open end of the through hole 211 facing away from the substrate, and an end of each of the hole sections 221 close to the substrate may be disposed in any of the sacrificial layers. For example, the end of each of the hole sections 221 close to the substrate is disposed in the first sacrificial layer 201.

When the first region A is a central area of the film layer stack structure 2 and the second region B is an edge region of the film layer stack structure 2, a plurality of hole sections 221 through which the substrate is not exposed may be formed at the edges of the film layer stack structure 2. A plurality of through holes 211 distributed in an array may be formed in the center of the film layer stack structure 2. For example, each of the through holes 211 may be provided in a one-to-one correspondence with each of the storage node contact plugs 11 disposed in the first region A, and an open end of each of the through holes 211 close to the substrate may be contacted with a surface of the storage node contact plug 11 corresponding to the through hole, so that after a capacitor is formed in the through hole 211, the charges in the capacitor is stored by the storage node contact plug 11. FIG. 3 shows a structure after step S1205 in an embodiment of the manufacturing method according to the present disclosure is completed.

In step S130, the second region is patterned and etched to remove the film layer stack structure within the second region.

Figure 7:
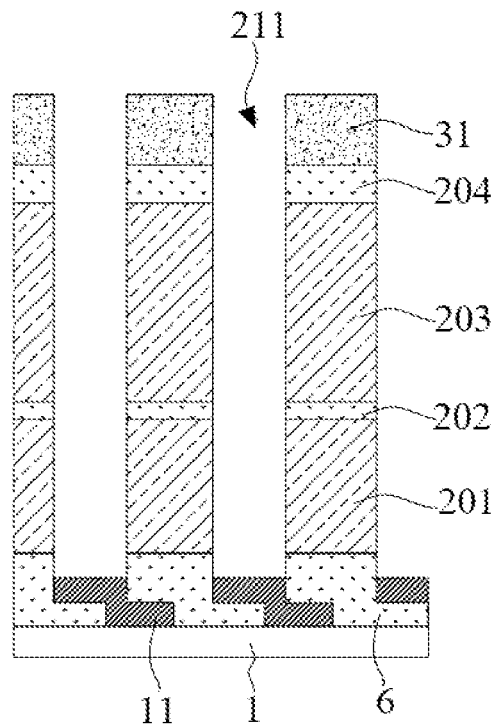
FIG. 7 is a schematic diagram after step S130 of the manufacturing method according to the present disclosure is completed.

The second region B may be patterned and etched by using a photolithography process to remove the film layer stack structure 2 within the second region B, and only the film layer stack structure within the first region A is retained, which prevents formation of a capacitor in the hole section 221 and avoids a case that the capacitor is in a floating status after the sacrificial layer is removed, and thus the stored power cannot be stored into the storage node contact plug 11, which causes the capacitor to fail; and meanwhile, which also avoids the capacitor being collapsed due to floating, and prevents a short circuit between adjacent capacitors. In an embodiment of the manufacturing method according to the present disclosure, a structure after step S130 is completed is as shown in FIG. 7.

Figure 8:
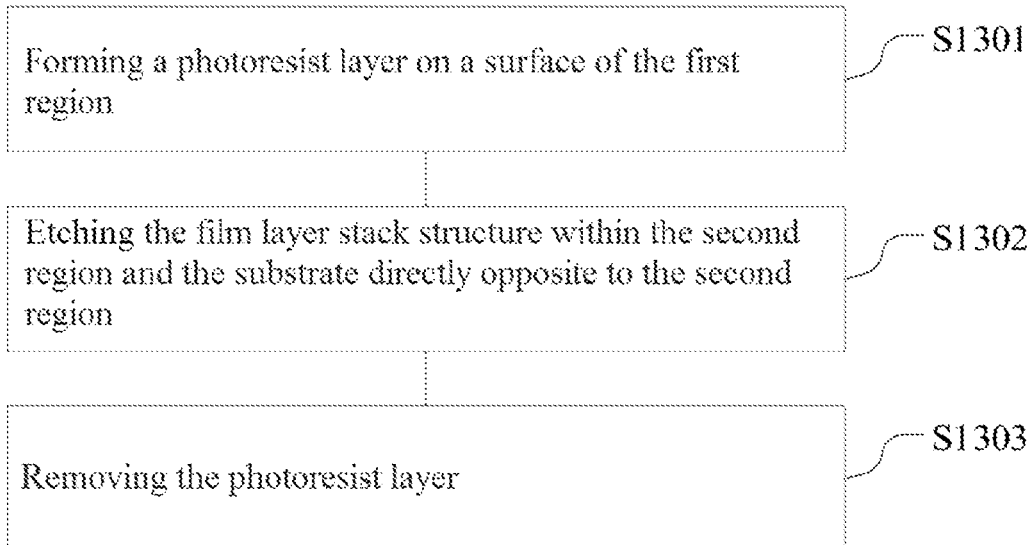
FIG. 8 is a flowchart of step S130 in FIG. 1.

In an embodiment of the present disclosure, as shown in FIG. 8, step S130 may include step S1301 to step S1303.

In step S1301, a photoresist layer is formed on a surface of the first region.

Figure 9:
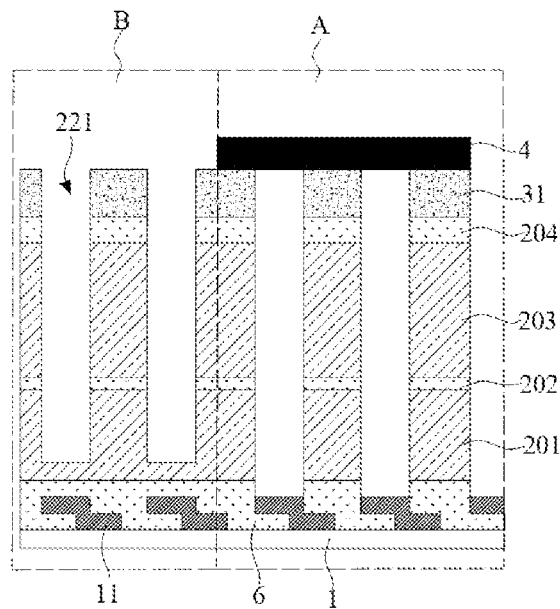
FIG. 9 is a schematic diagram after step S1301 of the manufacturing method according to the present disclosure is completed.

As shown in FIG. 9, the photoresist layer 4 may be formed on a surface of the hard mask layer 33 facing away from the substrate by spin coating, coating, chemical vapor deposition or other means. The photoresist layer 4 may be provided directly opposite to the first region A of the film layer stack structure 2 to prevent the first region A from being etched. The photoresist layer 4 may be made of positive photoresist or negative photoresist, which is not specifically limited here.

In step S1302, the film layer stack structure within the second region and the substrate directly opposite to the second region are etched.

The film layer stack structure 2 and the substrate may be etched in the second region B by a plasma etching process to remove each of the hole sections 221. For example, the film layer stack structure 2 and the substrate may be etched by an etching gas. For example, the film layer stack structure 2 within the second region B may be dry etched in a direction perpendicular to the film layer stack structure 2, wherein the etching gas chemically reacts with the material of the film layer stack structure 2 so as to remove the film layer stack structure 2 disposed in the second region B. The etching gas may be a single gas or a mixed gas of multiple gases, which is not specifically limited here.

For example, the etching gas may include at least one of carbon tetrafluoride gas or sulfur hexafluoride gas. For example, the etching gas may be carbon tetrafluoride gas, or may be sulfur hexafluoride gas, or a mixed gas of carbon tetrafluoride gas and sulfur hexafluoride gas. Of course, the etching gas may also be other gases that may be used to etch the film layer stack structure 2 and the substrate, which will not be listed here.

In step S1303, the photoresist layer is removed.

Figure 10:
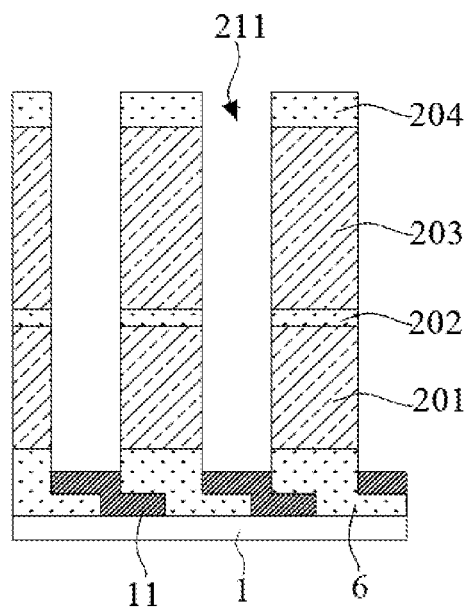
FIG. 10 is a schematic diagram after step S1303 of the manufacturing method according to the present disclosure is completed.

After the above-mentioned etching process is completed, the photoresist layer 4 may be removed by cleaning with a cleaning solution or by a process such as ashing, so that the first region A is no longer covered by the photoresist layer 4, and the hard mask layer 33 is removed at the same time, and the formed film layer stack structure 2 is exposed. FIG. 10 shows a structure after step S1303 of the manufacturing method according to the present disclosure is completed.

As shown in FIG. 1, the manufacturing method according to the present disclosure may further include step S140.

In step S140, a capacitor array is formed in each of the through holes.

Figure 11:
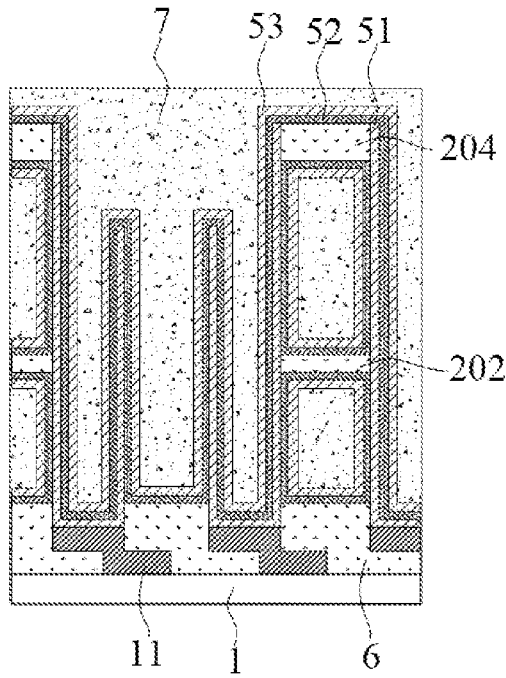
FIG. 11 is a schematic diagram after step S140 of the manufacturing method according to the present disclosure is completed.

A capacitor array may be formed in each of the through holes 211 of the first region A by vacuum evaporation, magnetron sputtering, chemical vapor deposition, or atomic layer deposition, or the like. As shown in FIG. 11, the capacitor array may include a plurality of pillar-shaped capacitors 5 arranged at an interval and a conductive layer 7 covering a surface of each of capacitor arrays. Each of the pillar-shaped capacitors 5 may be contacted and connected with each of the storage node contact plugs 11. When in use, the plurality of capacitors may be charged or discharged at the same time, thereby increasing the capacitance. The conductive layer 7 may be in contact with the capacitor array, so as to electrically lead out the capacitors.

Each pillar-shaped capacitor 5 may include a lower electrode layer 51, a capacitor dielectric layer 52, and an upper electrode layer 53. The lower electrode layer 51 is strip-shaped, which may be formed on the sidewalls and bottom of the through hole 211, and may be disposed on a side of the storage node contact plug 11 facing away from the substrate. The lower electrode layer 51 may be contacted and connected with the storage node contact plug 11, and the lower electrode layer 51 may extend in a direction perpendicular to the storage node contact plug 11 to the side of the storage node contact plug 11 facing away from the substrate, so as to form the pillar-shaped capacitor 5. The capacitor dielectric layer 52 is disposed between the lower electrode layer 51 and the upper electrode layer 53, which may form a double-sided capacitor so as to increase the capacitance. Each of the supporting layers may cover an outer circumference of the lower electrode layer 51, and may support the lower electrode layer 51 laterally so as to increase stability of the lower electrode layer 51 in the lateral direction and to prevent the lower electrode layer 51 from being deformed laterally.

Figure 12:
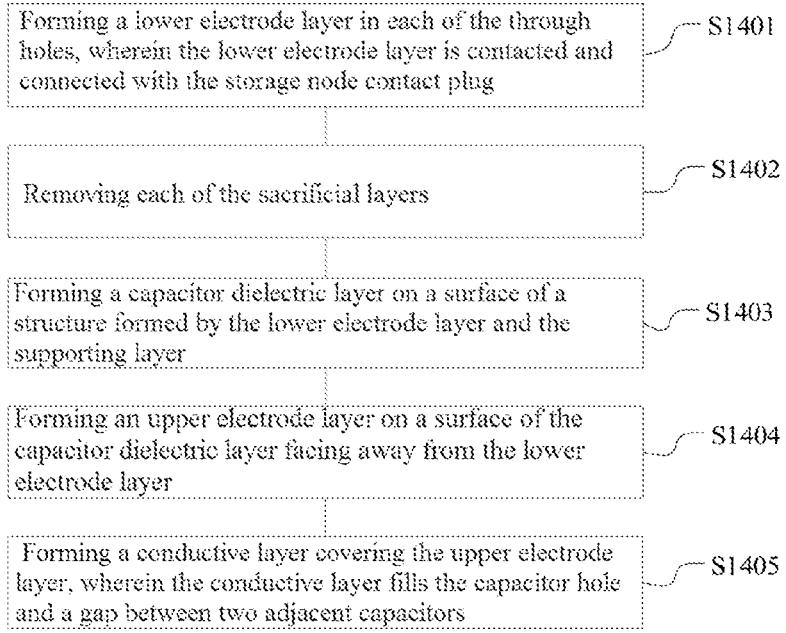
FIG. 12 is a flowchart of step S140 in FIG. 1.

In an embodiment of the present disclosure, a capacitor array is formed in each of the through holes 211, that is, step S140 may include step S1401 to step S1405, as shown in FIG. 12.

In step S1401, a lower electrode layer is formed in each of the through holes, wherein the lower electrode layer is contacted and connected with the storage node contact plug.

Figure 13:
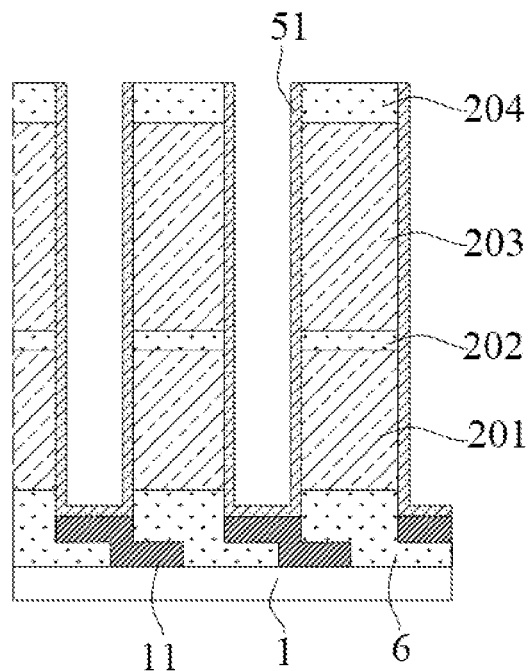
FIG. 13 is a schematic diagram after step S1401 of the manufacturing method according to the present disclosure is completed.

The through hole 211 may be used as a capacitor hole, and the lower electrode layer 51 may be formed on the sidewalls of the through hole 211. Specifically, the lower electrode layer 51 conformally attached to the bottom and sidewalls of the capacitor hole may be formed in the capacitor hole. For convenience of process, the lower electrode layer 51 may be formed within the capacitor hole and on a top surface of the capacitor hole at the same time. Subsequently, the lower electrode layer 51 on the top surface of the capacitor hole may be removed, and only the lower electrode layer 51 on the bottom and sidewalls of the capacitor hole is retained. The structure of the lower electrode layer 51 finally formed is as shown in FIG. 13. Furthermore, the lower electrode layer 51 may be contacted and connected with the storage node contact plug 11 via the capacitor hole, so as to input the power stored in the lower electrode layer 51 into the storage node contact plug, thereby realizing capacitor storage.

For example, the lower electrode layer 51 may be formed in the capacitor hole by using a chemical vapor deposition process. Of course, the lower electrode layer 51 may also be formed by other processes. The lower electrode layer 51 may be made of titanium nitride. Of course, the lower electrode layer 51 may also be made of other materials that may be used as electrodes. The material and forming process of the lower electrode layer 51 are not specifically limited here.

In step S1402, each of the sacrificial layers is removed.

Figure 14:
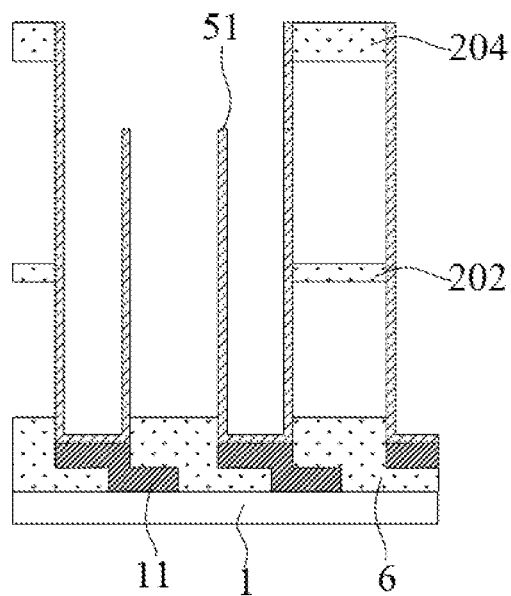
FIG. 14 is a schematic diagram after step S1402 of the manufacturing method according to the present disclosure is completed.

As shown in FIG. 14, after the lower electrode layer 51 is formed, each of the sacrificial layers in the first region A may be removed, and each of the supporting layers is retained, which not only can increase storage density of the capacitor, but also can provide support for the lower electrode layer 51, so as to avoid the lower electrode layer 51 being deformed outwards and to reduce risk of a short circuit.

In step S1403, a capacitor dielectric layer is formed on a surface of a structure formed by the lower electrode layer and the supporting layer.

Figure 15:
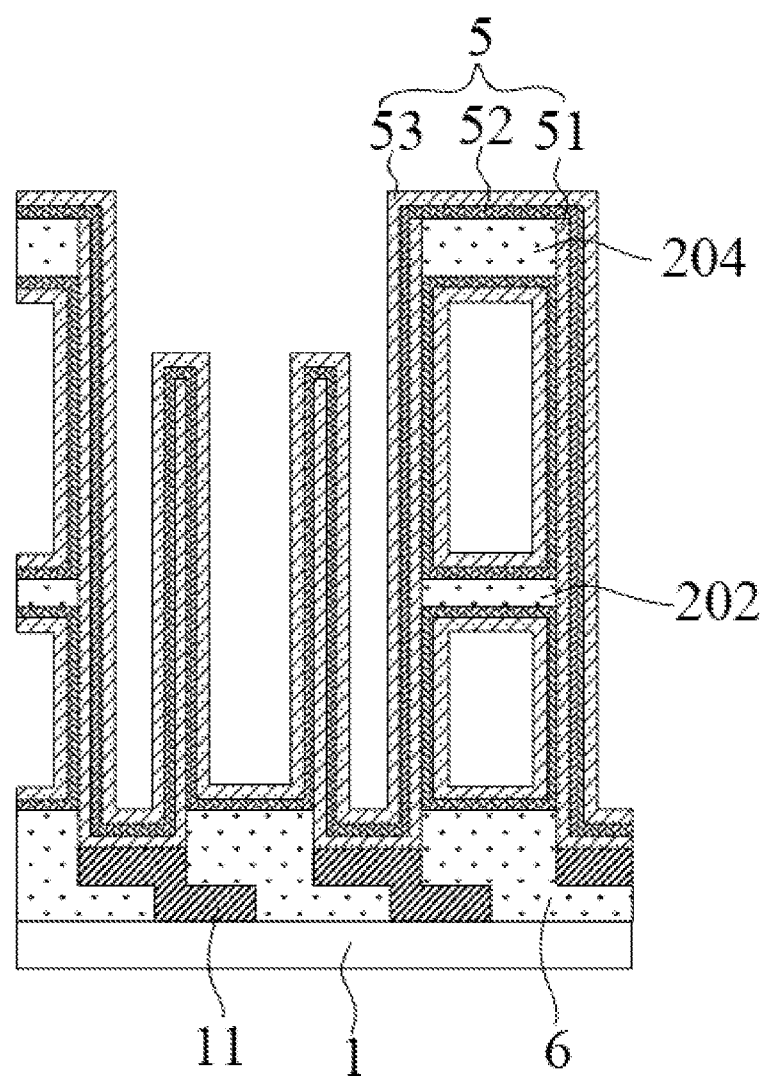
FIG. 15 is a schematic diagram after step S1404 of the manufacturing method according to the present disclosure is completed.

As shown in FIG. 15, the capacitor dielectric layer 52 may be formed on the lower electrode layer 51 within the capacitor hole of the first region A. For example, the capacitor dielectric layer 52 may be a thin film formed on a surface of the lower electrode layer 51. The capacitor dielectric layer 52 may be formed by a process such as vacuum evaporation or magnetron sputtering. Of course, the capacitor dielectric layer 52 may also be formed by other processes, which will not be listed here. The capacitor dielectric layer 52 may have a single-layered structure made of the same material, or may have a multi-layered structure made of film layers of different materials. For example, the capacitor dielectric layer 52 may be made of a material with a high dielectric constant, and for example, may be made of aluminum oxide, hafnium oxide, lanthanum oxide, titanium oxide, zirconium oxide, tantalum oxide, niobium oxide, strontium oxide or a mixture thereof. Of course, the capacitor dielectric layer 52 may also be made of other materials, which will not be listed here.

In step S1404, an upper electrode layer is formed on a surface of the capacitor dielectric layer facing away from the lower electrode layer.

The upper electrode layer 53 may be formed on an outer surface of the capacitor dielectric layer 52 by using a chemical vapor deposition process. Of course, the upper electrode layer 53 may also be formed by other processes, which is not specifically limited here. The upper electrode layer 53 may be made of titanium nitride. Of course, the upper electrode layer 53 may also be made of other materials, which will not be listed here. In an embodiment of the manufacturing method according to the present disclosure, a structure after step S1404 is completed is as shown in FIG. 15.

In step S1405, a conductive layer covering the upper electrode layer is formed, wherein the conductive layer fills the capacitor hole and a gap between two adjacent capacitors.

As shown in FIG. 11, the conductive layer 7 may be formed on a surface of the upper electrode layer 53 by a vacuum evaporation process, so that the charges are fully contacted with the upper electrode layer 53, which helps to improve a charging efficiency of the capacitor. The conductive layer 7 may cover the surface of the upper electrode layer 53, and may fill the through hole 211 and the gap between two adjacent capacitors, which may not only electrically lead out the capacitor and may also enhance stability of the capacitors in the capacitor array. The conductive layer 7 may be made of silicon material, metal material or metal compound. For example, the conductive layer 7 may be made of silicon, germanium silicon, tungsten, titanium silicide, titanium oxide, or tungsten oxide, etc., which is not specifically limited here.

An embodiment of the present disclosure further provides a semiconductor device, wherein the semiconductor device may be prepared by the method for manufacturing a semiconductor device according to any one of the above embodiments.

The specific details of each part of the above-mentioned semiconductor device and the manufacturing process thereof have been described in detail in the corresponding method for manufacturing a semiconductor device, and thus will not be repeated here. The semiconductor device may be a memory chip, for example, a dynamic random-access memory (DRAM). Of course, the semiconductor device may also be other semiconductor devices, which will not be listed here. For the beneficial effects of the semiconductor device, reference may be made to the beneficial effects of the above-mentioned hard mask structure, which will not be repeated here.

Other embodiments of the present disclosure will be easily conceived by those skilled in the art after taking the Description into consideration and practicing the solution disclosed herein. The present application is intended to cover any variations, uses, or adaptive changes of the present disclosure. These variations, uses, or adaptive changes follow the general principles of the present disclosure and include common general knowledge or conventional technical means in the art that are not disclosed herein. The Description and the embodiments are to be regarded as being exemplary only. The true scope and spirit of the present disclosure are subject to the appended claims.

What is claimed is:

1. A method for manufacturing a semiconductor device, comprising:
    providing a substrate and forming a film layer stack structure thereon;
    etching the film layer stack structure to form a first region containing a through hole through which the substrate is exposed and a second region containing a hole section through which the substrate is not exposed; and
    patterning and etching the second region to remove the film layer stack structure within the second region; and,
    wherein there are a plurality of the through holes, the substrate directly opposite to the first region comprises a plurality of storage node contact plugs, and each of the storage node contact plugs is exposed through each of the through holes in a one-to-one correspondence.

2. The method according to claim 1, wherein etching the film layer stack structure to form a first region containing a through hole through which the substrate is exposed and a second region containing a hole section through which the substrate is not exposed comprises:
    forming a mask material layer on a side of the film layer stack structure facing away from the substrate;
    forming a photoresist layer on a surface of the mask material layer facing away from the substrate;

exposing and developing the photoresist layer to form a plurality of developing regions, wherein the mask material layer is exposed through each of the developing regions;

etching the mask material layer in the developing region to form a mask pattern; and anisotropically etching the film layer stack structure based on the mask pattern, wherein the substrate acts as an etching stop layer, and the through hole is formed in the film layer stack structure disposed in the first region and the hole section is formed in the film layer stack structure disposed in the second region.

3. The method according to claim 1, wherein patterning and etching the second region to remove the film layer stack structure within the second region comprises:

forming a photoresist layer on a surface of the first region;

etching the film layer stack structure within the second region and the substrate directly opposite to the second region; and removing the photoresist layer.

4. The method according to claim 3, wherein etching the film layer stack structure within the second region and the substrate directly opposite to the second region comprises:

dry etching the film layer stack structure within the second region in a direction perpendicular to the film layer stack structure by using an etching gas.

5. The method according to claim 4, wherein the etching gas comprises at least one of carbon tetrafluoride gas or sulfur hexafluoride gas.

6. The method according to claim 1, wherein the first region is a central region of the film layer stack structure, and the second region is an edge region of the film layer stack structure.

7. The method according to claim 1, wherein the method further comprises:

forming a capacitor array in each of the through holes.

8. The method according to claim 7, wherein the film layer stack structure comprises a supporting layer and a sacrificial layer which are overlapped in a direction perpendicular to the substrate, and forming the capacitor array in each of the through holes comprises:

forming a lower electrode layer in each of the through holes, wherein the lower electrode layer is contacted and connected with the storage node contact plug;

removing each of the sacrificial layers;

forming a capacitor dielectric layer on a surface of a structure formed by the lower electrode layer and the supporting layer;

forming an upper electrode layer on a surface of the capacitor dielectric layer facing away from the lower electrode layer; and forming a conductive layer covering the upper electrode layer, wherein the conductive layer fills the through hole and a gap between two adjacent capacitors.

9. A semiconductor device, wherein the semiconductor device is prepared by the method for manufacturing a semiconductor device according to claim 1.

10. A semiconductor device, wherein the semiconductor device is prepared by the method for manufacturing a semiconductor device according to claim 2.

11. A semiconductor device, wherein the semiconductor device is prepared by the method for manufacturing a semiconductor device according to claim 3.

12. A semiconductor device, wherein the semiconductor device is prepared by the method for manufacturing a semiconductor device according to claim 4.

13. A semiconductor device, wherein the semiconductor device is prepared by the method for manufacturing a semiconductor device according to claim 5.

14. A semiconductor device, wherein the semiconductor device is prepared by the method for manufacturing a semiconductor device according to claim 6.

15. A semiconductor device, wherein the semiconductor device is prepared by the method for manufacturing a semiconductor device according to claim 8.

16. A semiconductor device, wherein the semiconductor device is prepared by the method for manufacturing a semiconductor device according to claim 9.

* * * * *